United States Patent [19]
Giomi et al.

[11] Patent Number: 5,537,580
[45] Date of Patent: Jul. 16, 1996

[54] INTEGRATED CIRCUIT FABRICATION USING STATE MACHINE EXTRACTION FROM BEHAVIORAL HARDWARE DESCRIPTION LANGUAGE

[75] Inventors: Jean-Charles Giomi, Woodside, Calif.; Gerard Tarroux, Villeneuve-Loubet, France

[73] Assignee: VLSI Technology, Inc., San Jose, Calif.

[21] Appl. No.: 362,028

[22] Filed: Dec. 21, 1994

[51] Int. Cl.⁶ .................................................. G06F 17/00
[52] U.S. Cl. ...................... 395/500; 364/488; 364/489; 364/490
[58] Field of Search ...................... 364/488, 490, 364/491, 578; 395/500

[56] References Cited

U.S. PATENT DOCUMENTS

| | | | |
|---|---|---|---|
| 4,907,180 | 3/1990 | Smith | 364/578 |
| 4,967,367 | 10/1990 | Piednoir | 364/489 |
| 5,146,583 | 9/1992 | Matsunaka et al. | 395/500 |
| 5,299,137 | 3/1994 | Kingsley | 364/489 |
| 5,369,596 | 11/1994 | Tokumaru | 364/491 |
| 5,371,683 | 12/1994 | Fukazawa et al. | 364/489 |
| 5,396,435 | 3/1995 | Ginetti | 364/489 |

OTHER PUBLICATIONS

Collis, "The Requirments for a VDHL Based Custom IC, ASICI or FPGA Design Process", IEEE 1993, pp. 1–7.
Kahrs, "Matching a parts Library in a Silicon Compiler", IEEE 1986, pp. 169–172.
Kam et al. "Comparing Layouts with HDL Models: A Formal Verification Technique", IEEE 1992, pp. 588–591.
Micallef–Trigona, "Datapath Intensive ASIC Design—Synthesis From VHDL", IEEE 1993, pp. 1–4.
Palnitkar et al., "Finite State Machine Trace Analysis Program", IEEE 1994, pp. 52–57.
Sait et al., "VLSI Layout Generation of a Programmable CRC Chip", IEEE 1993, pp. 911–916.
S. Devadas, et al., A. R. Newton and A. S. Vincentelli, "Mustang: State Assignment of Finite State Machines Targeting Multi–Level Logic Implementations," IEEE Trans. on Computer–Aided Design, Dec. 1988, pp. 1290–1300.

(List continued on next page.)

*Primary Examiner*—Kevin J. Teska
*Assistant Examiner*—Tan Nguyen
*Attorney, Agent, or Firm*—Hickman, Beyer & Weaver

[57] ABSTRACT

A method for fabricating an integrated circuit includes the steps of: (a) describing the functionality of an integrated circuit in terms of a behavioral hardware description language, where the hardware description language describes behavior which can be extracted as a state machine; (b) extracting a register level state machine transition table of the state machine from the hardware description language; (c) generating a logic level state transition table representing the state machine from the register level state machine description; (d) creating a state machine structural netlist representing the state machine from the logic level state transition table; and (e) combining the state machine structural netlist with an independently synthesized structural netlist to create an integrated circuit structural netlist including the state machine to provide a basis for chip compilation, mask layout and integrated circuit fabrication. The method results in a synchronous state machine being extracted from an register-transfer (RT) level representation taken from a scheduled behavioral hardware description language description such as a Verilog or VHDL. Behavioral hardware description language constructs such as "if", "case", "for" statements and sub-program calls can describe the state machine. A logic level state transition table represents each extracted state machine, and each extracted state machine includes control logic produced by previous synthesis phases such as data-path and memory synthesis.

27 Claims, 9 Drawing Sheets

OTHER PUBLICATIONS

T. Villa et al., "Nova, State Assignment of Finite State Machine for Optimal Two Level Logic Implementation," IEEE Trans. on Computer–Aided Design, Sep. 1990, pp. 905–924.

R. Brayton et al., "MIS: A Multiple–Level Logic Optimization System," IEEE Trans. on Computer–Aided Design, Nov. 1987, vol. CAD–6, pp. 1062–1081.

S. Hayati et al., "Automatic Production of Controller Specifications From Control and Timing Behavioral Descriptions," in Proc. 26th Design Automation Conference, 1989.

D. Grant et al., "Memory, Control, and Communications Synthesis for Scheduled Algorithms," 27th Design Automation Conference, 1993.

5,537,580

1

INTEGRATED CIRCUIT FABRICATION USING STATE MACHINE EXTRACTION FROM BEHAVIORAL HARDWARE DESCRIPTION LANGUAGE

BACKGROUND OF THE INVENTION

This invention relates generally to the automated design of integrated circuits (ICs) and more particularly to the automated synthesis of state machines.

Several types of computer aided design (CAD) tools are used to design and fabricate integrated circuits. An important CAD tool for IC design is the "behavioral synthesis" design tool wherein the behavior (e.g. inputs, outputs, functionality, etc.) of a desired IC are entered into a computer system, and synthesis software running on the computer designs an integrated circuit that exhibits that behavior. Such tools permit integrated circuit designers to produce increasingly complex integrated circuits, sometimes numbering in the millions of gates, with fewer errors and in a much shorter time than would be possible with manual design techniques.

The process of behavioral synthesis begins with integrated circuit specifications encoded in a hardware description language (HDL) such as Verilog® available from Cadence Design Systems, Inc. of Santa Clara, Calif. or VHDL® available from IEEE of New York, N.Y. Specifications define an integrated circuit in terms of desired inputs and outputs, as well as desired functionality such as clock speed. From the HDL, a "netlist" including a list of gates and their interconnections is generated which describes the circuitry of the desired IC.

Automated IC design can include both synthesis and optimization. As is well known to those skilled in the art, synthesis includes any desired combination of synthesis techniques which occur as various levels of abstraction. In particular, architectural level synthesis, logic level synthesis, and geometrical level synthesis may be incorporated into IC design methods.

Architectural level synthesis operates with functional blocks, their interconnections and, to some extent, their internal operations. In other words, architectural level synthesis is concerned with the macroscopic structure of the circuit. Architectural level synthesis includes register transfer (RT) level synthesis, which can have multi-bit components such as registers and operators.

Logic level synthesis is concerned with gate level design. Logic level synthesis determines a microscopic structure of a circuit and transforms a logic model into an interconnection of instances of library cells. The result of the logic level synthesis is a netlist of logic devices and their interconnections. In the past, state machine synthesis was performed at the logic synthesis level and included optimization such as state minimization and state encoding. Logic-level synthesizers are available commercially from such companies as Synopsis, Inc. of Mountain View, Calif.

Geometrical level synthesis (sometimes called chip compilation) results in a physical layout of devices and their interconnections. The geometrical level synthesis is sometimes referred to as physical design and provides a link between circuit design and fabrication. The geometrical level layout (mask layout) represents all circuit geometries and is used to control an apparatus which fabricates I.C. masks. The layout is a set of two-dimensional layers corresponding to a number of masks. The relative position of the circuit geometries corresponds to the I.C. devices as well as to device interconnections. The fabrication masks are used in photolithographic equipment during the manufacture of integrated circuits having the desired functionality. Typical chip compilers and mask layout tools may be, for example, those which are commercially available from a number of vendors including Compass Design Automation of San Jose, Calif.

A process of prior art automated design is shown in FIG. 1a and includes state machine extraction at a logic level. In this prior art process, HDL descriptions are transformed into a logic level representation. A state machine transition table is extracted bit-by-bit from a Boolean equation at the logic level. In a n=16 bit structure, for example, the step of state machine extraction is repeated 16 times. This repetitive state machine extraction is computationally intensive and, therefore, slow and expensive. After the n state machine extractions are made, a state machine generator combines the n state machines and inputs the state machines into a chip compiler. The output of the chip compiler is used to create IC masks in a mask layout tool, and integrated circuits are produced using the IC masks.

The state machine representations derived from the logic level representations may be optimized by an appropriate technique, such as a state encoding or a logic minimization technique. These techniques optimize the state transition table (STT) or state transition graphs (STG) which represent state machines.

State transition tables are typically extracted from structural netlists at the logic level when a set of sequential elements used as state register are provided. Except for sequential components, all combinational logic is extracted. Extracting all combinational logic, however, is computationally burdensome and therefore undesirable.

In higher-level synthesis, (e.g. architectural level) state machine extraction from a STT derived from a previously scheduled data control flow graph has been attempted in conjunction with control unit synthesis. This technique is described by S. Hayati and A. Parker, in "Automatic Production Of Controller Specifications From Control And Timing Behavioral Descriptions", *Proc.* 26th Design autornation Conference, 1989; and by D. Grant, and P. Denyer, in "Memory, Control, and Communications Synthesis for Scheduled Algorithms", *27th Design Automation Conference*, 1990. However, high-level synthesis including extraction of state machines from behavioral HDL's has not been addressed.

SUMMARY OF THE INVENTION

The present invention extracts state machines from a hardware description language (HDL) such as VERILOG or VHDL as part of a process for manufacturing integrated circuits. A compiler of the present invention converts the HDL into register transfer (RT) level behavioral expressions which describe state machines. These state machine transition tables are then extracted from the RT level behavior expressions on a state-by-state basis with a state machine extraction tool. From the extracted register level state machine transition table, a state transition table (STT) is built in an incremental fashion. The STT describes state machines at the logic level to permit generation of a state machine structural netlist. The state machine structural netlist is combined with independently generated netlists to produce an IC structural netlist used for chip compilation, mask layout and, ultimately, IC fabrication.

More specifically, a method of the present invention for fabricating an integrated circuit includes the steps of: (a)

describing the functionality of an integrated circuit in terms of a behavioral hardware description language, where the hardware description language describes behavior which can be extracted as a state machine; (b) extracting a register level state machine transition table of the state machine from the hardware description language; (c) generating a logic level state transition table representing the state machine from the register level state machine description; (d) creating a state machine structural netlist representing the state machine from the logic level state transition table; and (e) combining the state machine structural netlist with an independently synthesized structural netlist to create an integrated circuit structural netlist including the state machine to provide a basis for chip compilation, mask layout and integrated circuit fabrication.

A method of integrated circuit fabrication including register transfer level state machine extraction from a behavioral hardware description language of the present invention includes the steps of: (a) inputting a hardware description language into a digital computer with a user input device, the hardware description language describing a state machine in terms of behavior; (b) extracting a register level state transition table from the hardware description language with a state machine extraction tool implemented on the computer; (c) generating a logic level state transition table with a logic level state transition table tool implemented on the computer; (d) synthesizing a state machine structural netlist from the logic level state transition table with a state machine compiler tool implemented on the computer; and (e) combining on the computer the state machine structural netlist with an independently synthesized structural netlist to create an integrated circuit structural netlist.

A system for fabricating an integrated circuit in accordance with the present invention includes a digital computer system and a hardware description language input into the digital computer with a user input device, where the hardware description language describes a state machine in terms of behavior. An extractor extracts a register level state transition table from the hardware description language, and a transition table generator generates a logic level state transition table. A synthesizer implemented on the computer synthesizes a state machine structural netlist from the logic level state transition table, and a combiner combines, on the computer, the state machine structural netlist with an independently synthesized structural netlist to create an integrated circuit structural netlist.

An advantage of the present invention is that it provides a method for extracting state machines from a behavioral HDL, and thus greatly improves the efficiency of the extraction of state machines from a functional description of an integrated circuit. This facilitates in the production of very-large scale integration (VLSI) and ultra-large scale integration (ULSI) integrated circuits because it is more computationally efficient and, therefore, makes it more practical to design complex integrated circuits.

These and other advantages of the present invention will become apparent upon a study of the following detailed descriptions and the accompanying drawings.

DETAILED DESCRIPTION OF THE PREFERRED EMBODIMENTS

The present invention is particularly useful in the design and production of application specific integrated circuits (ASICS). However, it will be appreciated by those skilled in the art from the following descriptions that the methodologies and systems described herein have applications to several IC fabrication systems which rely upon state machine extraction from HDL behavioral representations, and can thus be implemented in a number of different technologies.

Figure 1A:
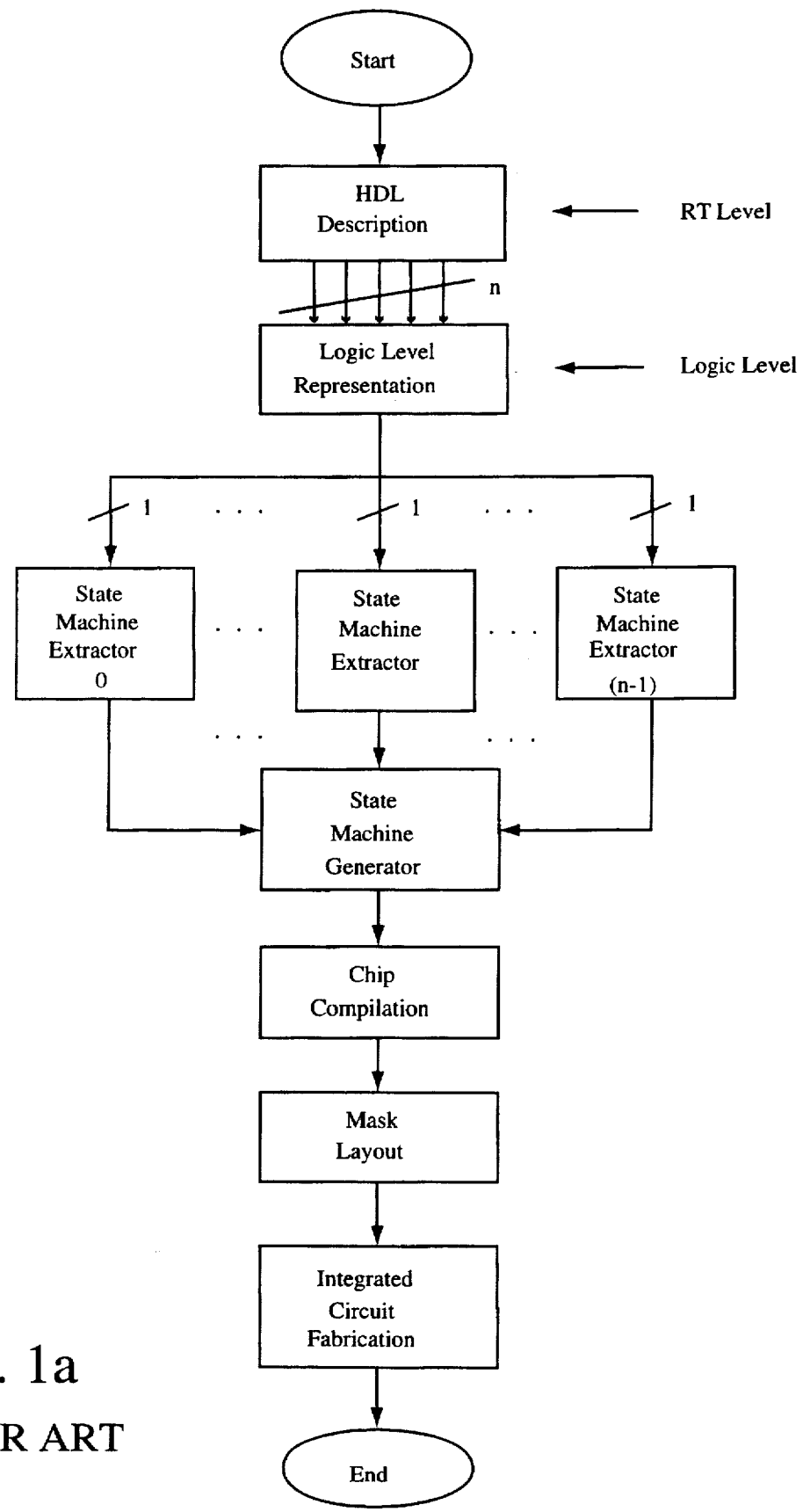
FIG. 1a is a flow diagram of a prior art method of state machine extraction from a logic level representation.
Figure 1B:
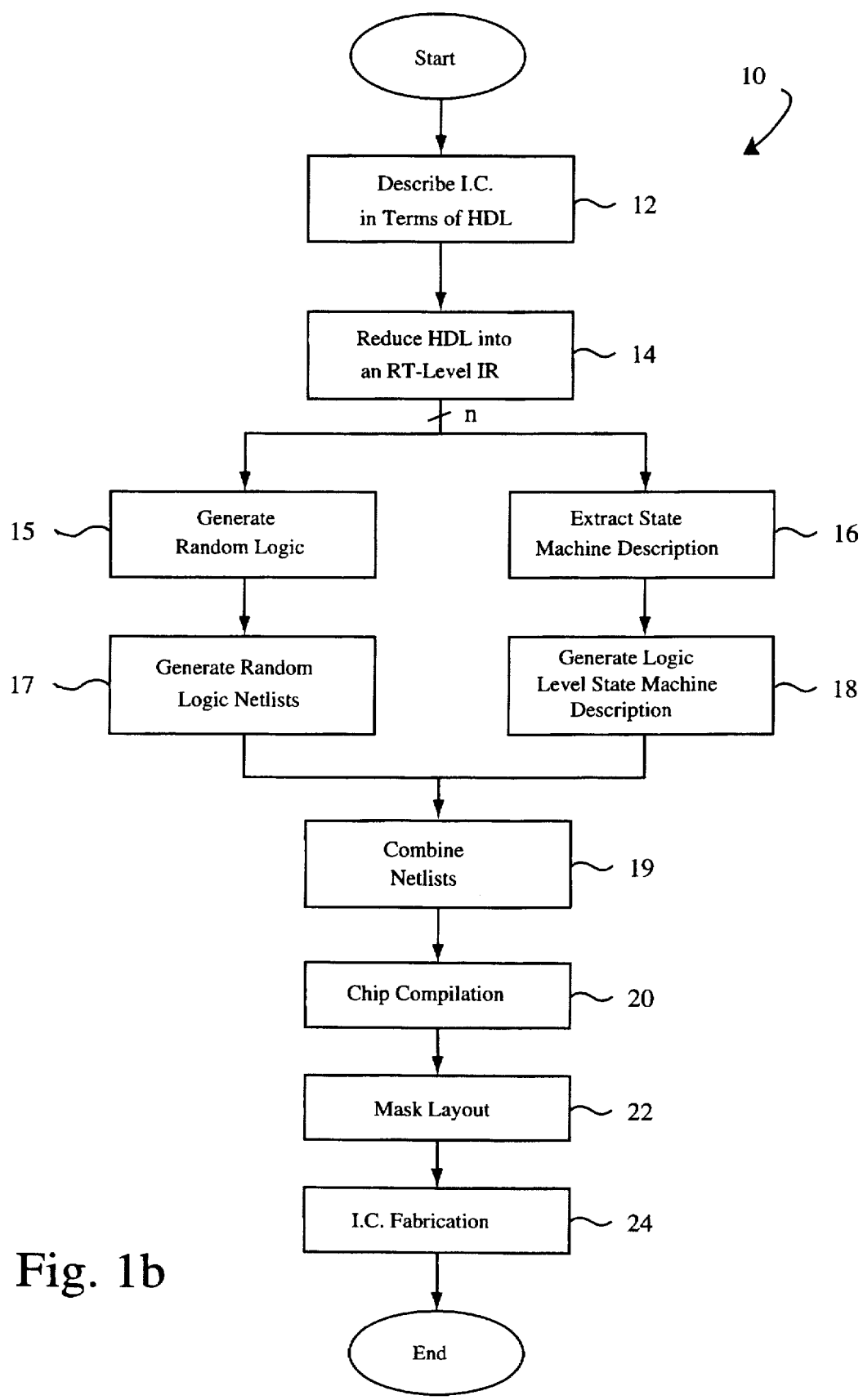
FIG. 1b is a flow diagram of a method in accordance with the present invention for fabricating an integrated circuit from a behavioral hardware description language.

FIG. 1a was described with reference to the prior art. In FIG. 1b, a method for designing and fabricating an integrated circuit in accordance with the present inventive concept is illustrated. First, in a step 12, an integrated circuit (IC) behavioral description is provided by a user and is input into a computer (to be described with reference to FIG. 1c) of an integrated circuit fabrication process 10. The IC description step 12 describes the IC in terms of inputs, outputs, and functionality thorough a hardware description language (HDL), as is well known to those skilled in the art. Next, in a step 14, the HDL is reduced into a register transfer (RT) level intermediate representation (IR). These are typically (n) multi-bit representations. Random logic is generated in a step 15, and state machine transition tables are extracted from the multi-bit representations in a step 16. A random logic netlist is generated in a step 17, and a logic level state machine transition table is generated in a step 18 and is used to generate a state machine structural netlist. The random logic netlist and the state machine structural netlist are combined in a step 19 to form an IC netlist, which is used by the chip compilation step 20. The steps of chip compilation 20, mask layout 22 with a mask layout device, and integrated circuit fabrication 24 with an IC fabrication device follow, as are well known to those skilled in the art of IC fabrication. Appropriate testing and optimization may occur at various levels of abstraction as desired.

The HDL in a preferred embodiment is Verilog® provided by Cadence Design Systems, Inc. of Santa Clara, Calif. In another preferred embodiment, the HDL is VHDL® which the IEEE standard. The present inventive concept, however, is adaptable for a variety of HDLs.

A compiler of the present invention includes a parser, a lexical analyzer, and a syntax analyzer. The compiler reduces the HDL behavioral description that was input in step 12 into the intermediate representation (IR) in step 14 and is, therefore, implicit in step 14. Typically, the compiler comprises specialized computer-implemented processes running on a general purpose computer. The lexical analyzer is a component of the compiler that reads the source model and produces, as an output, a set of tokens that the parser uses for syntax analysis. The parser receives the set of tokens, and syntax rules of the HDL are verified and satisfied. The parser generates set of parse trees, where each parse tree is a representation of the syntactic structure of a HDL. The parser detects syntactic and semantic errors. In the preferred embodiment of the present invention, the step of reducing the HDL into an RT level intermediate representation employs a commercially available parser, such as a VHDL parser. Additionally, an equation generator generates RT level expressions from the parse tree representations.

The intermediate representation (IR) of the circuit to be synthesized produced by step 14 is represented by a control flow graph B(V,E), where V is bounded and represents a set and E represents a binary relation on V. The elements of the set V are vertices and those of the set E are edges of the graph. Each control node v of set V represents control operations derived from initial description constructs such as if, case, assign, loop, and sub-program call constructs. The edges give the precedence relation between control nodes. All control node conditions (IF, CASE, LOOP) and control node expressions (ASSIGN) are represented by a directed acyclic graph (DAG) representative of partially ordered sets and derived from syntax-directed analysis. Each leaf of a DAG is a constant value, signal, or variable. Each node of a DAG is a RT-level data operation.

Directed-acyclic graphs (DAG's) represent data expressions extracted from each control flow graph B(V,E) by symbolic simulation techniques. In this way data expressions describing the behavior of each data-element in the integrated circuit to be synthesized can be described. Loop folding is performed to reduce execution delay in various loops and eliminate cycle in the initial control flow graph B(V,E). Sub-program calls are replaced in-line, but recursive sub-program calls and loops with unknown bounds at simulation time are not supported. Accordingly, each data expression is represented by directed-acyclic graphs using extra nodes derived from IF and CASE statements.

Each DAG is optimized through a set of semantic-preserving transformations that minimize the amount of information needed to specify the partial order of tasks. Behavioral optimization techniques include constant propagation, expression simplification and common sub-expression sharing. Suitable optimization techniques are described by A. V. Aho et al., in *Compilers: Principles, Techniques and Tools*, Addison-Wesley, 1986.

Figure 1C:
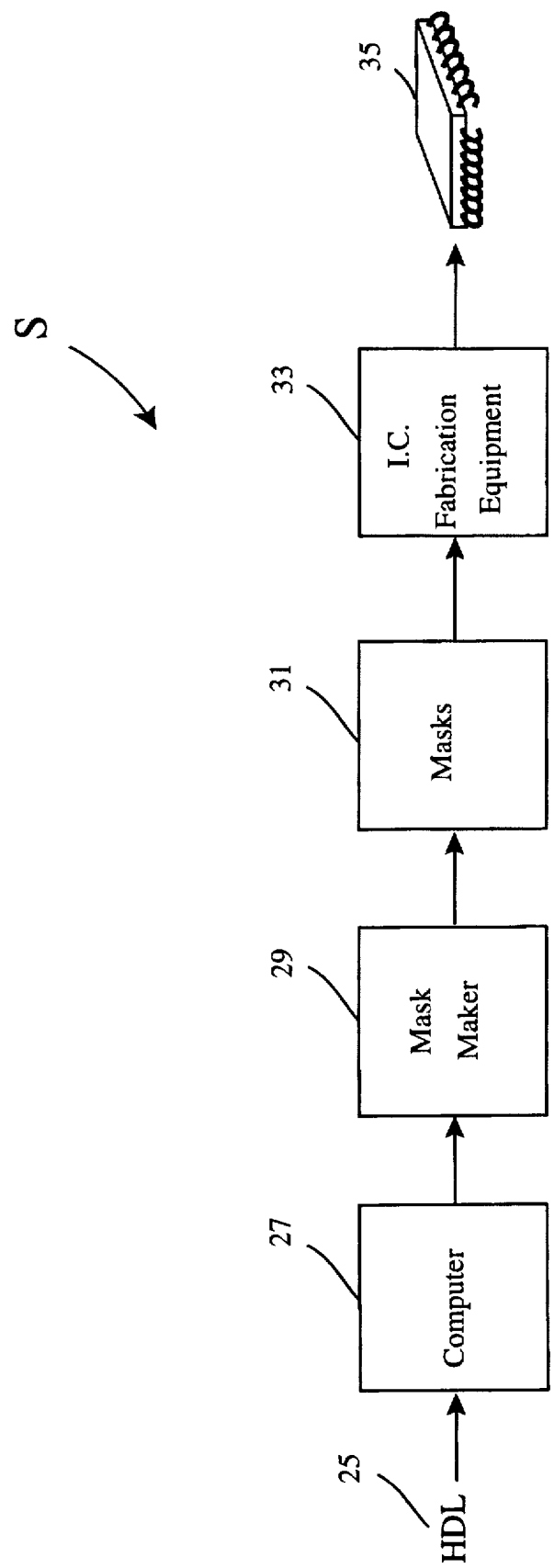
FIG. 1c illustrates a physical system in accordance with the present invention for implementing the method of FIG. 1b.

In FIG. 1c, a physical system S in accordance with the present invention takes an HDL input 25, enters it into a computer 27 for implementing the synthesis process, makes IC masks in a mask maker 29, and uses the masks in IC fabrication equipment 33 to make ICs 35. The making and using of the various components of the system S are well known to those skilled in the art, with the exception of the process of the present invention implemented on the computer 27.

An example of a computer system 27 suitable for use with the present 1.5 invention is an HP 700 Series workstation, available from Hewlett-Packard, Cupertino, Calif. or a SUN SPARC workstation available from Sun Microsystems, Inc., of Mountain View, Calif. Of course, other computer systems that are capable of supporting integrated circuit synthesis are also suitable. The mask maker 29 can either be implemented as a part of the computer system 27 or as a separate system. An example of a suitable mask generator in machine form is MEBES® available from Mebes, Inc. An example of a mask generator in software form (to run on computer system 27) is DRACULA® available from Cadence Design Systems, Inc., of Santa Clara, Calif.

Figure 2:
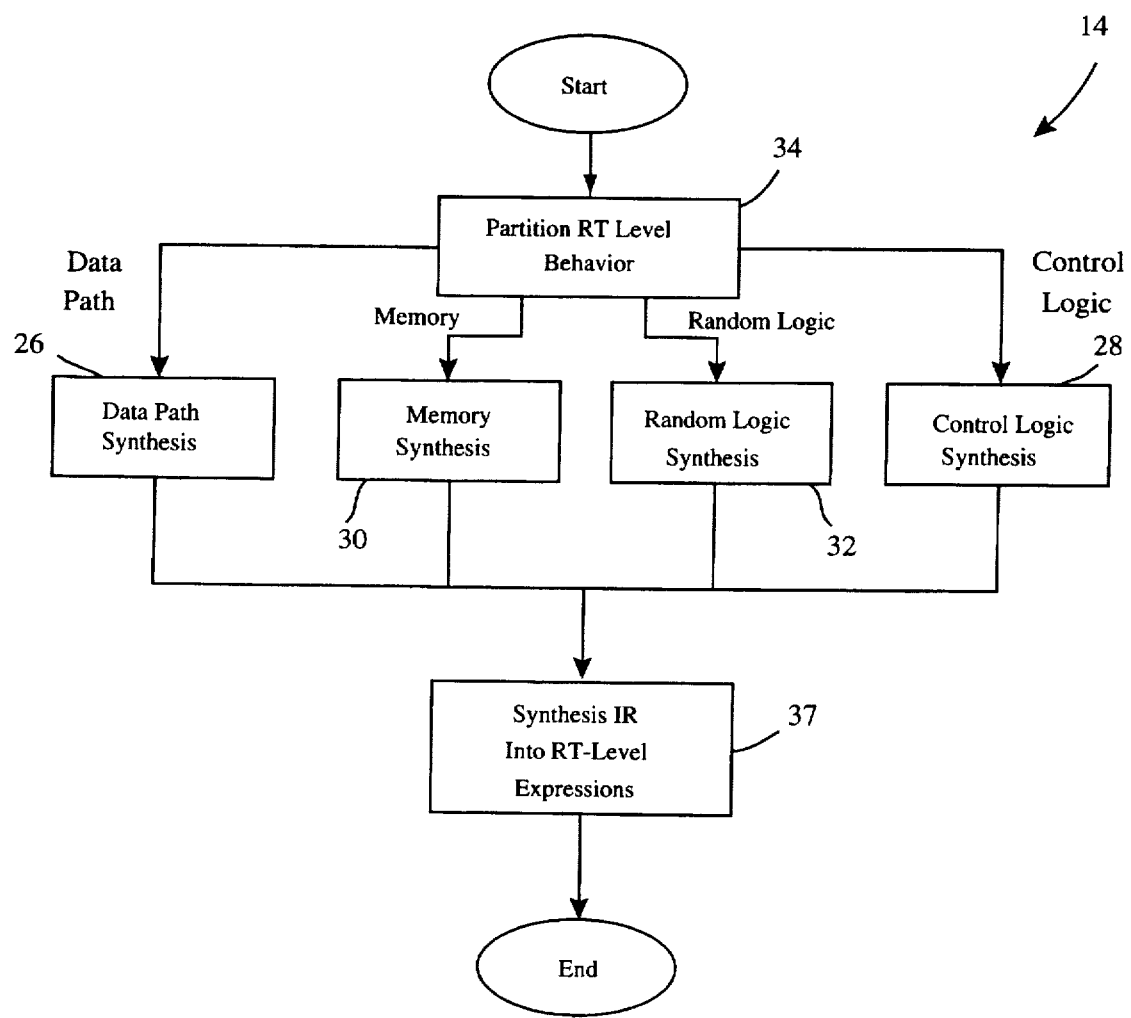
FIG. 2 is a flow diagram detailing the "Reduce HDL Into an RT-Level IR" step 14 of FIG. 1b.

With reference to FIG. 2, a synthesizer used in step 14 of FIG. 1b for symbolic simulation does not change the scheduling of the operations given in the initial IC behavioral description and control flow graph. The synthesizer is one capable of separate synthesis of data path logic in a step 26 and control logic in a step 28 from VHDL, Verilog and graphical inputs; resource sharing; logic synthesis and optimization; and library binding. An appropriate synthesizer is commercially available as an "ASICS Synthesizer" from Compass Inc. of San Jose, Calif., which is a wholly owned subsidiary of VLSI Technology, Inc.

The synthesizer partitions IC behaviors in a step 34 into datapath, control logic, memory, and random logic. Appropriate synthesis and optimization techniques are separately applied to each partitioned behavior. More particularly, datapath synthesis 26 is applied to the datapath, control logic synthesis 28 is applied to the control logic, memory synthesis 30 is applied to the memory, and random logic synthesis 32 is applied to the random logic. Techniques for partitioning and synthesis are well known to those skilled in the art.

Control logic synthesis, when viewed as a synchronous implementation of control as with the present invention, employs a finite-state machine as a model. State machine synthesis follows memory and datapath synthesis in order to include extraneous control logic generated as a result of memory and datapath synthesis, respectively. The remaining logic which is unrelated to the state machine is implemented in random logic. Appropriate synthesis techniques include those discussed by Nels Vander Zanden, in *Synthesis of Memories From Behavioral HDL's*, ASIC Conference and exhibit, Rochester, N.Y. 1994; and M. Mahmood et al. in *A Datapath Synthesizer for High-Performance ASIC's*, IEEE Custom Integrated Circuits Conference, Boston, Mass., May 3–6, 1992. The outputs of the synthesizers 26–32 are synthesized into IR (RT-level) expressions in step 37.

Figure 3:
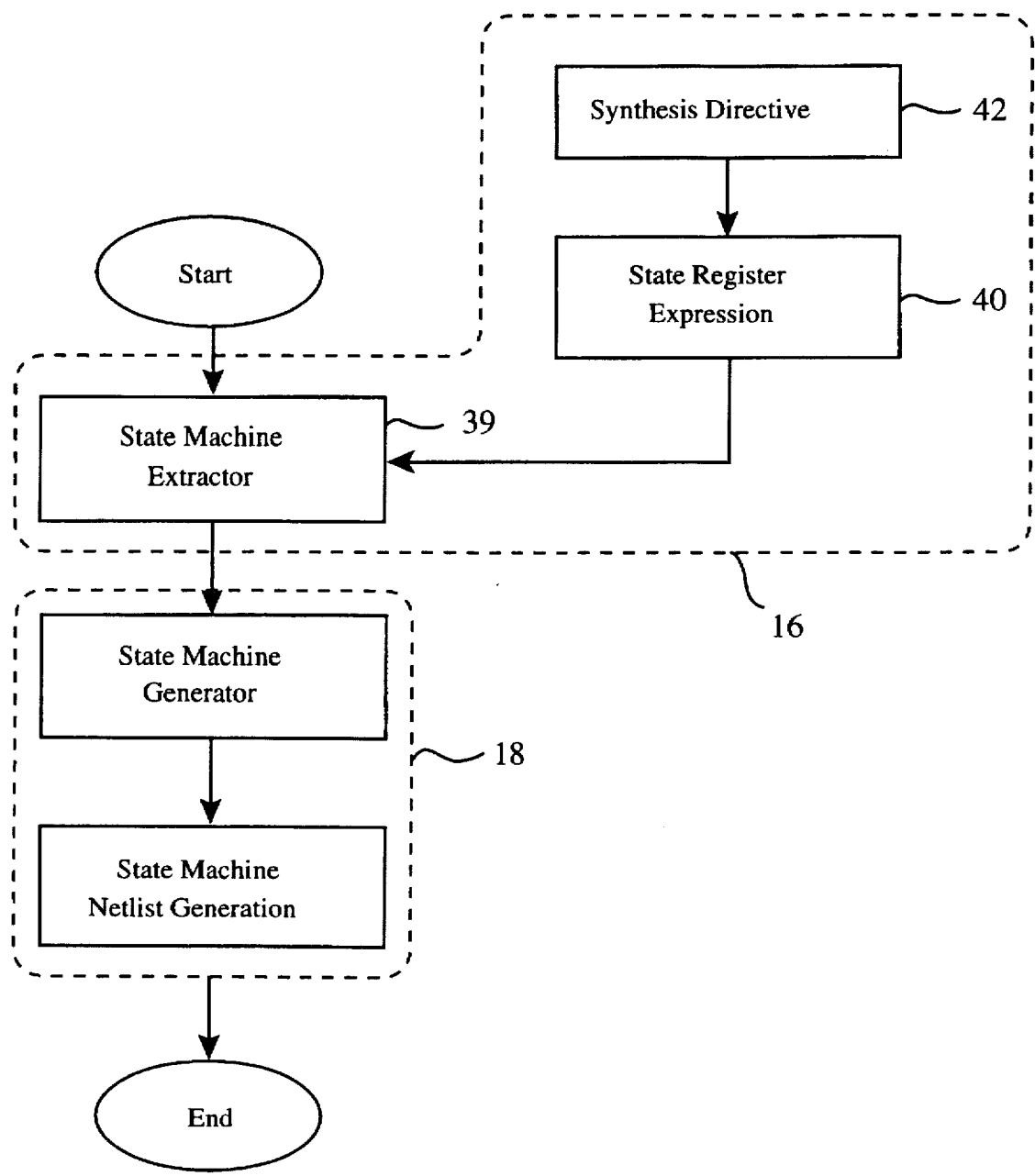
FIG. 3 is a flow diagram illustrating the "Extract State Machine Description" step 16 and "Generate Logic Level State Machine Description" step 18 of FIG. 1b in greater detail.

The context in which state machine synthesis occurs in accordance with the present inventive concept can be generally appreciated in conjunction with FIG. 3 which illustrates steps 16 and 18 of FIG. 1b in greater detail. State machine synthesis includes state machine extraction step 16 and state machine generation step 18. State machine extraction step 16 includes a state machine extractor 39 and results in generation of a logic-level state transition table (STT). State machines are generated from the STT, as will be appreciated by those skilled in the art. The STT is built incrementally tables of values and conditions which are extracted from RT level state machine transition tables which are presented as functions or expressions of a state register 40 accessed by the state machine extractor 39. The state transition table tabulates state transition and output functions which correspond to a graph-based representation known as a state transition diagram. In the preferred embodiment, a state machine is represented by a STT which defines states, state transition, and state output expressions within each state. State reassignment includes state encoding, i.e. encoding the state variable. This reduces the amount of logic needed to implement the state machine.

Circuit complexity is related to the number of storage bits used for the state representation (i.e. encoding length) and to the size of the combinational component. A measure of the size of the combinational component varies. Accordingly, state encoding techniques for two-level implementations are independent of state encoding techniques for multi-level implementations. An appropriate encoding method is provided by a user through a synthesis directive 42 coupled to the state register 40. The synthesis directive is input to the computer and is a signal representing both the encoding method and the state variable. As can be appreciated, there is no automatic state register selection. The state variable is not synthesized in the datapath even if it uses arithmetic operator.

Figure 4:
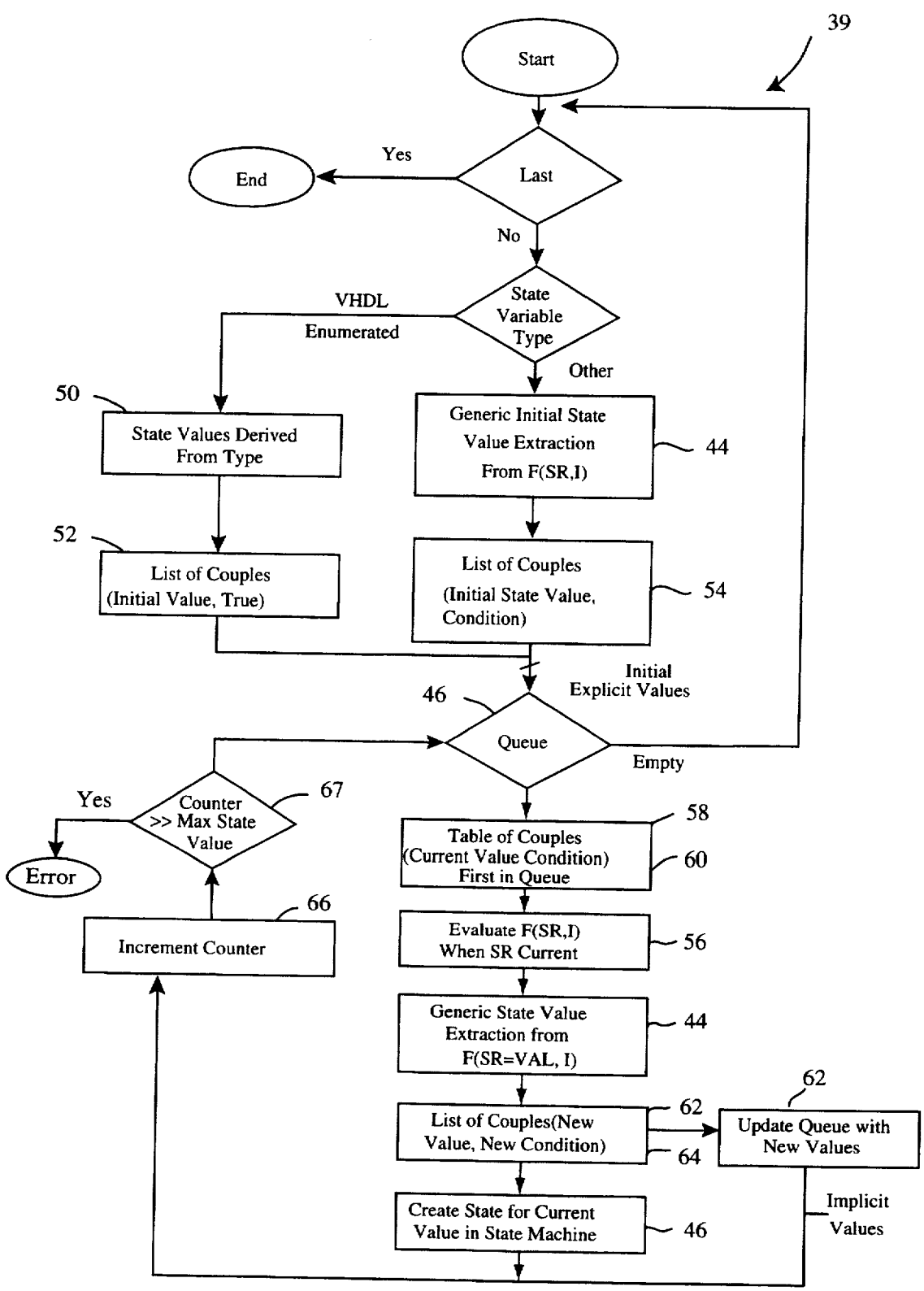
FIG. 4 is a flow diagram detailing the state machine extractor 39 of FIG. 3 in greater detail.

With additional reference to FIG. 4 which illustrates the state machine extractor 39 in greater detail, a sequential model of a finite-state machine is characterized by a set of actions which coincide with states and input patterns. A state is declared by an enumerated type variable in the state register. Initial state values are extracted from the enumerated type variable, or if the variable type is not enumerated, then by a generic state value extraction step 44. The set of actions are the bodies of a branching constructs whose clause relates to a state in the state register and associated input values (I). The set of actions are primarily combinational logic statements. Thus, the compilation of finite-state machine models entails state recognition and processing of the combinational logic statements.

A state machine is extracted in a sequential, state-by-state manner from DAG's representing data expressions given state values from the state register. The state machine is described using behavioral HDL constructs such as "if", "case", "for" statements and sub-program calls. The state register is defined in a clocked block, VHDL "process" or Verilog "always", for example. For a more specific example, a state machine described using one VHDL clocked process is described with VHDL in FIG. 1 of Appendix "A". An additional example is found in FIG. 2 of Appendix "A" where a state machine is described using one clocked process and one combinational process. The next state value is defined as combinational logic which is assigned to the state register on a clock edge. Having the state machine description shown in FIG. 1 of Appendix "A", the state register DAG after symbolic simulation is shown in Appendix "B". Explicit state values extracted with their conditions associated from the state register DAG are also shown. In Appendix "C", the construction of the resulting STT is described.

As shown in FIG. 4, extracted state values representing initial states are arranged as a list of couples of values and conditions and stored in a queue. State machine extraction is accomplished by extracting a state transition table from DAG's representing the IC behavioral expressions, and from the state register DAG by symbolic simulation techniques.

The directed acyclic graph of the state register is transformed (i.e. reduced in complexity) by a logically favorable method, or combination of methods, into a form more suitable for symbolic simulation. Such logically favorable methods will modify the number of literals, the local functions and their dependencies, but will not adversely affect area and performance of the network. In the preferred embodiment, transformation consists of substitution which replaces all combinational data-element nets other than the state register by associated expressions. The transformed DAG represents an expression of the state register and other data elements which could not be replaced. This simplification is useful, for example, when a state machine is described with two processes or always blocks defining the sequential and combinational behavior of the state machine. A next state combinational data element depending on state register data elements and other data elements is assigned in a sequential block to the state register data elements. The transformation replaces all occurrences of the next state data elements in the state register DAG by the next state data element DAG. The synthesizer gives an error when the transformation cannot be performed when, for example, the sub-data elements are not combinational (for example, multi-clocked behavioral descriptions).

The state register DAG is communicated sequentially and generic state value extraction follows. Generic state value extraction step 44, however, occurs at two levels. On a first level, state values are extracted first from the state register 40. On a second level, state values are extracted from a queue 46. On both levels, the format F(SR,I) is anticipated where SR is the state register expression and I represents inputs.

State values extracted on the first level, (from the state register), are extracted from the state register variable type, or from state register directed acyclic graph (DAG). State value extraction from the state register variable type includes listing all possible initial state values which the state register allows in the form of couples 52. For example, in VHDL, an enumeration literal type lists all possible literals for which a corresponding value can be compared, or with which a corresponding signal can be assigned. Where types define a very large set of possible values (e.g. VHDL integer), the initial state values should be extracted from the state register DAG.

State values extracted from state register directed acyclic graphs include a list of all possible state values that the state register DAG can be evaluated to when all DAG leaves are constants. This approach is based on extracting for each DAG a list of possible values and conditions that need to be true for the DAG to be evaluated to the listed values. The extraction method applies recursively on all directed acyclic graph nodes and produces a list of couples in a step 54 of initial values and initial conditions associated with the listed values at each call.

On the second level, generic state value extraction 44 is applied to F(SR,I) where SR is evaluated in step 54 with current values 58 and current conditions 60 are evaluated from the queue 46. With current values and current conditions extracted, a list of new values are developed in a step 62 and new conditions 64 are generated in the form of couples and the queue 46 is updated with the new values 62. An increment counter step 66 counts the number of loops. A step 67 produces an error message if the counter number exceeds a maximum allowable state value. An example of a software routine which extracts values/conditions from DAG expressions is represented in Appendix A attached hereto.

When the state machine extraction relies on the extraction of values/conditions from directed acyclic graphs, such as with generic state value extraction, the number of possible extracted values may be very large. State value extraction, thus, can be numerically complex. In order to reduce the complexity of state value extraction, the extraction method of the preferred embodiment partially derives values from the leave data-element nets and does not extract all implicit state values for a given directed acyclic graph.

State value extraction in a given state is divided into two parts; explicit state value extraction and implicit state value extraction. Accordingly, from the state register only initial explicit values are extracted. The initial explicit state values are the values that are explicitly assigned to the state register.

Therefore, it is a subset of all the values to which F(SR,I) can be evaluated. A list of couples indicating initial state values and associated conditions are generated and passed into the queue. As seen in FIG. 4, initial state values derived from the enumerated type variable are similarly passed into the queue as a list of couples indicating initial state values and the condition "true."

More particularly, the explicit state value extraction is performed first on the state register directed acyclic graphs in order to list all initial state values assigned or compared to the state register. However, when the type of the state register is an enumeration literal type, or defines a reasonable range, explicit state values are not extracted. Reset state values may be extracted. If a reset state value is extracted, the reset state value is included as an initial explicit state value. Initial explicit state values are then fed into the queue.

From the queue, tables of couples are passed having values defined as current values. With the current values, generic state value extraction occurs again. A new list of couples having new values and new conditions are generated. A state in the state machine is created with the current value. The queue is updated with the new values which can be implicit values.

The implicit state value extraction includes extracting explicit state values from directed acyclic graphs evaluated in a specific state such as the current state. The evaluation of the initial directed acyclic graphs in a given state is accomplished by substituting the state register data-element with the state value. Constant folding optimization reduce the new directed acyclic graphs produced so that implicit state values are now explicitly defined in the directed acyclic graphs. Thus, the value/condition lists correspond to the next state values/state transition conditions. The state transition table is built incrementally at each evaluation. With this method, only a subset of implicit state values are found. This subset is sufficient to extract most or all behavioral state machine descriptions. Accordingly, this method is adapted to derive values form the leave data-element nets of any desired width. An example of a software program used for building state transition tables is shown in Appendix B attached hereto.

For the following description, it will be useful to define certain terminology. The procedure call "evalValAndCond" will refer to a procedure which extracts from a directed acyclic graphs a list of possible values that an expression can take with the corresponding condition to be true. Values for leave data-elements are not generated. The procedure call "evalExpr(E,C)" will refer to a procedure which evaluates directed acyclic graphs expression E under condition C. "CreateState" creates the corresponding state in the RT-Level state table. A limit of the number of extracted state values is used in order to terminate the extraction of behaviors not suitable for state machine synthesis (for example 32-bit counters.) In the case of the state register expression which is represented by a simple if/then/else tree which maps a state transition table format, the complexity of the loop body is cubic in number of states when the average number of transitions per state is equivalent to the number of states.

Figure 5:
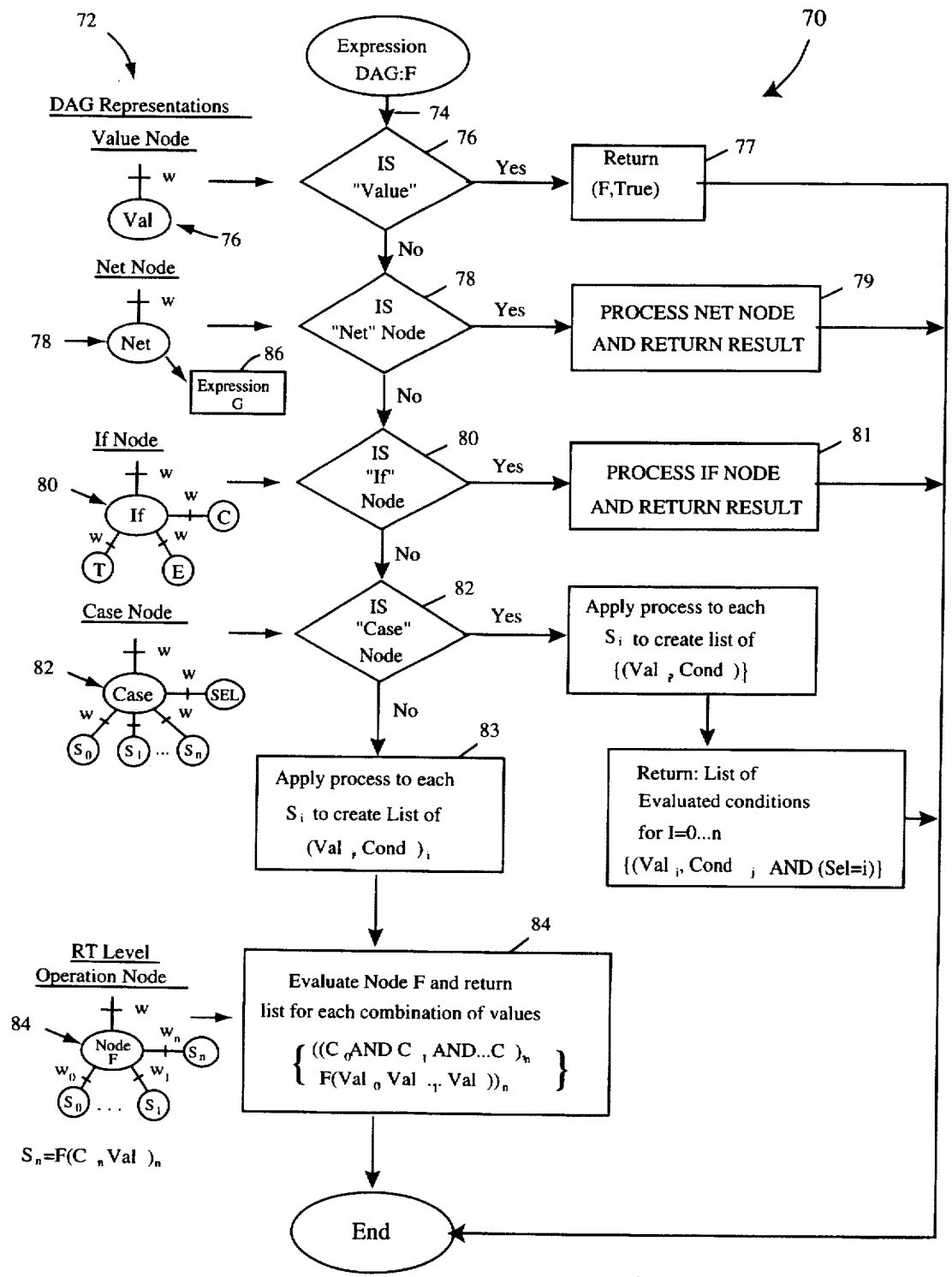
FIG. 5 is a flow diagram detailing the "Generic Initial State Value Extraction" step 44 of FIG. 4 side-by-side with directed acyclic graphs (DAGS) which illustrate the functionality of the associated nodes.

As shown in FIG. 5, DAG expression processing 70 corresponding primarily to step 44 of FIG. 4 (referred to as the "process") is shown and is further illustrated by associated DAG representations 72 positioned adjacent the node evaluation tree 74 and having arrows pointing to an associated node type. The process 70 recognizes value nodes 76, net nodes 78, if-then-else nodes 80, case nodes 82 and other RT level operators 84 (e.g. ADD, SUB, CONCAT, MULT, MOD, DIV, . . . ).

Figure 6:
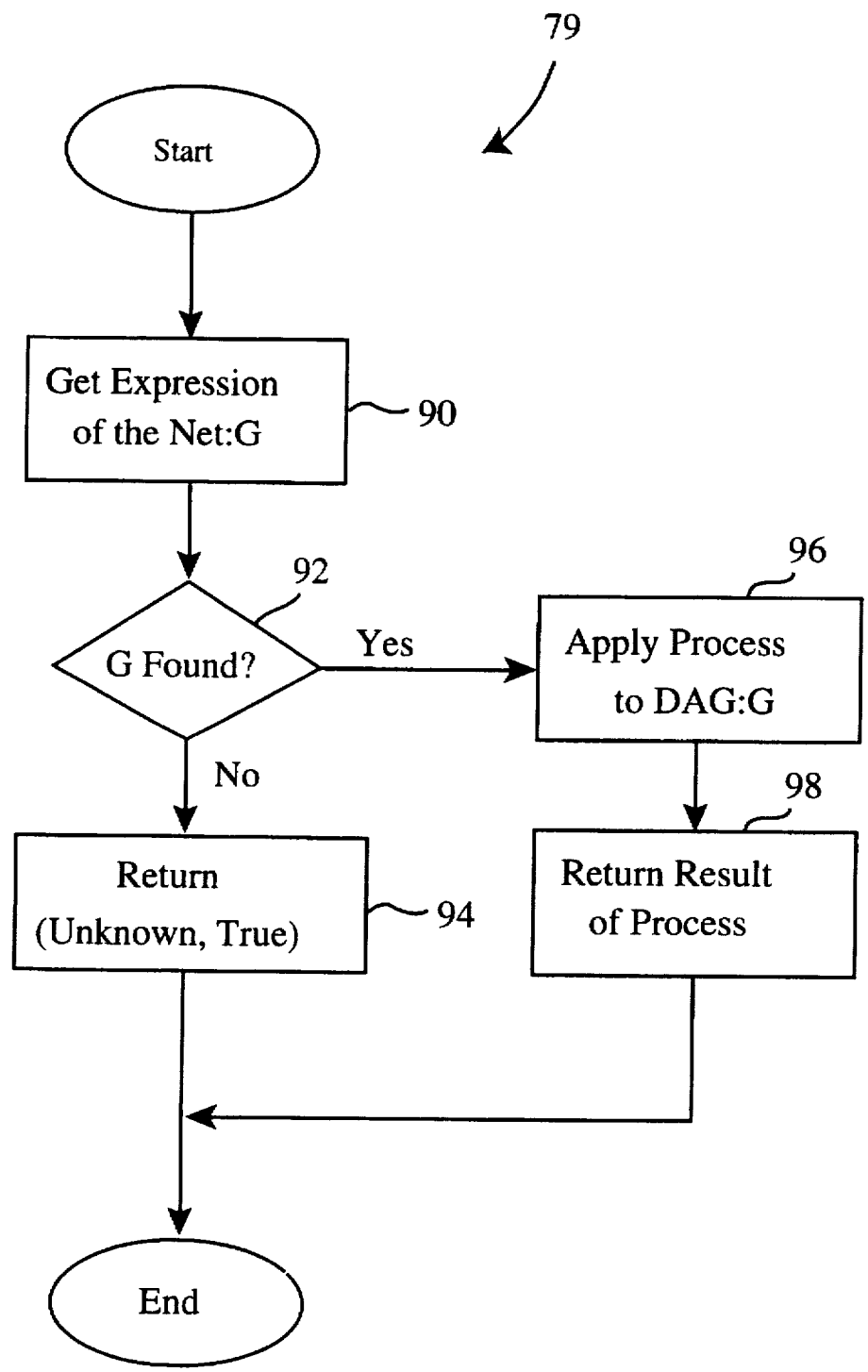
FIG. 6 is a flow diagram detailing the "Process Net Node and Return Result" step 79 of FIG. 5.

If the DAG node is a value node 76, the value and condition true are returned in a step 77. If the DAG is a net node 78, the process 70 is applied to each expression of the net. More particularly, each net node 78 may have an expression 86 attached which is shown as part of a DAG representation. As shown in FIG. 6, the expression "G" is attached. Accordingly, with "G" attached, the process 70 is applied to expression "G". The process result will be returned. If there is no expression found attached, the value "unknown" and condition "true" will be returned.

Figure 7:
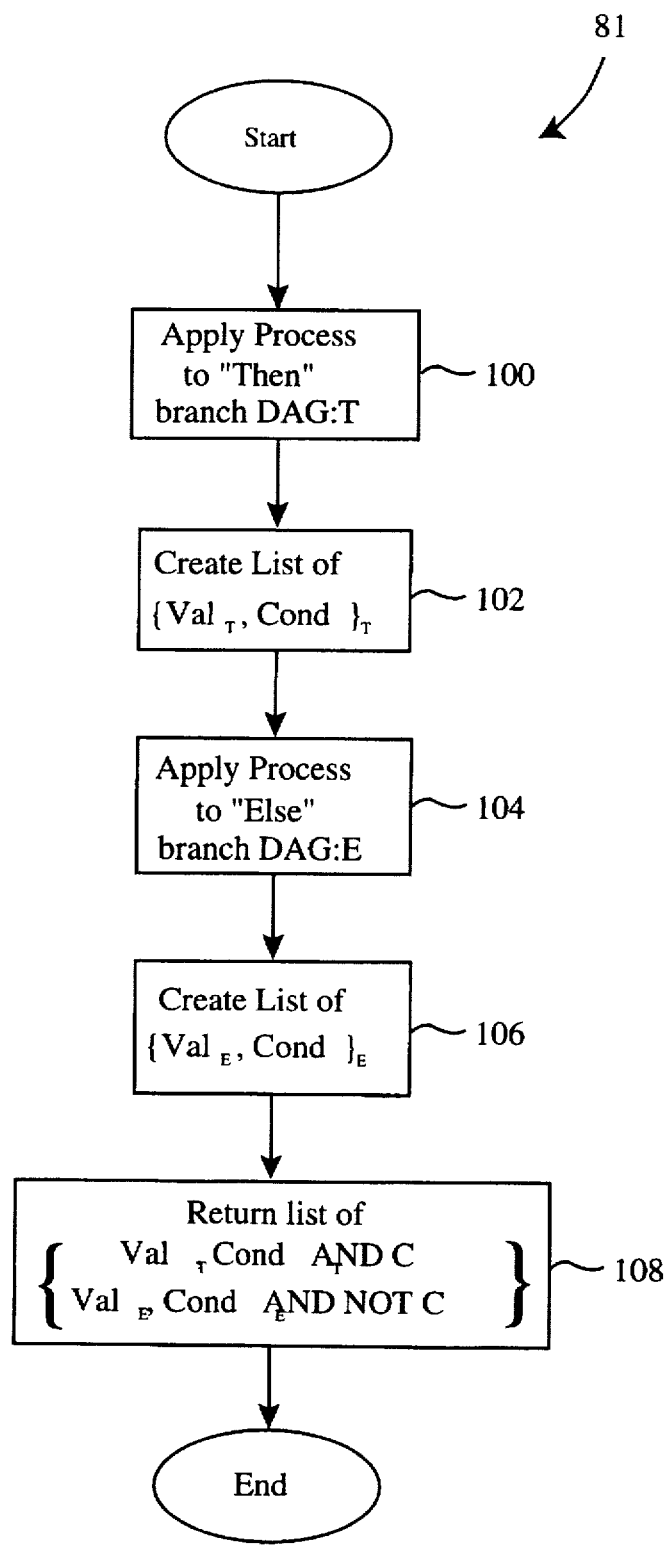
FIG. 7 is a flow diagram detailing the "Process If Node and Return Result" step 81 of FIG. 5.

If the DAG node is an "IF" node, as particularly described in FIG. 5 and FIG. 7, the process will be applied to the "then" branch. In FIG. 5, the DAG representation associated with the "IF" node includes a "then" branch marked as "T", an "ELSE" branch marked as "E", and a condition branch marked as "C". A list of sets of values and conditions associated with the "T" branch are created, the process is applied to the "E" branch of the DAG. A list of sets of values and conditions associated with "E" are generated. The condition "AND C" represents a logical AND appended to all conditions associated with branch "T". The condition "AND NOT C" is appended to all conditions associated with branch "E".

The DAG representation associated which the "CASE" node returns a list of conditions and values. More particularly, the process is applied to each $S_i$ and lists of values and conditions corresponding to each $S_i$ are created. For each node $S_i$, an addition condition is created which corresponds to having the selection node "sel" equals to "i". This condition is appended with a logical AND to the conditions returned by the processing of the node $S_i$. Accordingly, each node is evaluated and a list of appropriate values and conditions is returned.

When the node is an RT-level operation, the conditions of the sub-nodes are appended with a logical AND for each new value given by evaluating the operation with the values of sub-nodes $S_i$ as arguments. The conditions associated with constant value leaves in the directed acyclic graph are always true since there is no condition where a value will equal itself. In addition, values/conditions derived from the leave data-element nets are extracted recursively from the directed acyclic graph of the leave data-element. A cache stores values and conditions of processed sub directed acyclic graphs. Values with unsatisfied conditions are discarded. Thus, all possible state values which could result from the state register DAG are found. These state values can be implicitly inferred by the behavior (implicit state values). A sample algorithm describing extraction of values and conditions from a DAG expression is included in Appendix "C".

In FIG. 6, step 79 of FIG. 5 is illustrated in greater detail. First, in a step 90, the expression of the Net:G is obtained. Next, in step 92 it is determined if G is found. If "no", step 94 returns (unknown,true). If "yes", step 96 applied the process to DAG:G. Step 98 then returns the result of the process.

FIG. 7 illustrates step 81 of FIG. 5 in greater detail. The process 81 begins with step 100 wherein the process is applied to the "then" branch of DAG:T. Next, a list is created of {Val$_T$,CondT} in a step 102. A step 104 applies the process to the "else" branch DAG:E, and a step 106 creates a list of {Val$_E$,Cond$_E$}. Finally, in a step 108, a list of {[ValT,CondT and C], [Val$_E$,Cond$_E$ and not C]} are returned The device and methods described herein, in terms of a preferred embodiment enable the use of the present invention by one skilled in the art. This description, however, is illustrative and not intended to limit the scope of the present invention which are intended to encompass all embodiments within the true spirit and scope of the present invention.

Appendix "A"

FIG. 1: VHDL description of a state machine using one clocked process.

```
architecture oneProcess of smex is
begin
process ( clk , rst )
      variable state : integer range 0 to 9;
begin
      --compass statemachine adj state
      if (rst='0') then
            encode <= (others => '0');
            state := 0;
      elsif clk'event and clk = '1' then
            case state is
                  when 0 | 1 =>
                        if state = 0 then encode <= (0 => '1', others => '0'); end if,
                        if state = 1 then encode <= (1 => '1', others => '0'); end if,
                        state := state + 1;
                  when 2 =>
                        encode <= (others => '1');
                        if ctrl='1' and data(2)='1' then state :=4;
                        elsif ctrl='0' and data(2)='1' then state :=5;
                        elsif ctrl='1' and data(2)='0' then state := 6;
                        elsif ctrl='0' and data(2)='0' then state := 7;
                        else state := 3; end if,
                  when 3 =>
                        encode <= (others => '0');
                        state := 3;
                  when 4 to 6 =>
                        encode <= (others => data(state));
                        if ctrl='1' then state := state + 2;
                        else state := state + 3; end if;
                  when 7 | 8 | 9 =>
                        encode <= (others => '1');
                        state := 0;
                  when others =>
                        state := 0;
            end case;
      end if;
end process;
end oneProcess;
```

FIG. 2: VHDL description of a state machine using one clocked process and one combinational process.

```
architecture twoProcess of smex is
      signal state , nextstate : integer range 0 to 9;
begin
clocked : process ( clk , rst )
begin
      --compass statemachine adj state
      if (rst='0') then
            state <= 0;
      elsif (clk'event and clk='1') then
            state <= nextstate;
      end if;
end process;
comb : process ( ctrl , data, state )
begin
            case state is
                  when 0 | 1 =>
                        if state = 0 then encode <= (0 => '1', others => '0'); end if,
                        if state = 1 then encode <= (1 => '1', others => '0'); end if,
                        nextstate <= state + 1;
                  when 2 =>
                        encode <= (others => '1');
                        if ctrl='1' and data(2)='1' then nextstate <=4;
                        elsif ctrl='0' and data(2)='1' then nextstate <=5;
                        elsif ctrl='1' and data(2)='0' then nextstate <= 6;
                        elsif ctrl='0' and data(2)='0' then nextstate <= 7;
                        else nextstate <= 3; end if;
                  when 3 =>
                        encode <= (others => '0');
                        nextstate <= 3;
                  when 4 to 6 =>
                        encode <= (others => data(state));
                        if ctrl='1' then nextstate <= state + 2;
```

Appendix "A"

```
            else nextstate <= state + 3; end if;
        when 7 | 8 | 9 =>
            encode <= (others => '1');
            nextstate <= 0;
        when others =>
            nextstate <= 0;
    end case;
end process
```

Appendix "B"

```
((state=0) ? (state + 1)
: (state=1) ? (state + 1)
: (state=2) ? (((ctrl=1) and (data[2]=1)) ? 4
              : (((ctrl=0) and (data[21=1)) ? 5
              : (((ctrl=1) and (data[2]=0)) ? 6 : 7)))
: (state=3) ? 3
: (state=4) ? ((ctrl=1) ? (state + 2) : (state + 3))
: (state=5) ? ((ctrl=1) ? (state + 2) : (state + 3))
: (state=6) ? ((ctrl=1) ? (state + 2) : (state + 3))
: (state=7) ? 0
: (state=8) ? 0
: (state=9) ? 0
: (state=10) ? 0
: (state=11) ? 0
: (state=12) ? 0
: (state=13) ? 0
: (state=14) ? 0
: (state=15) ? 0)
```

The explicit state values extracted with their conditions associated from the state register DAG are:

```
(4, (state=2) and (ctrl=1) and (data[2]=1) )
(5, (state=2) and (ctrl=0) and (data[2]=1) )
(6, (state=2) and (ctrl=1) and (data[2]=0) )
(7, (state=2) and (ctrl=0) and (data[2]=0) )
(3, (state=3))
(0, (7<=state) and (state<=15))
```

Appendix "C"

The construction of STT is done incrementally as follow:
```
Value Queue: 4 5 6 7 3 0
State value = 4:
    ctrl=1 ---> 6,
    ---> 7;
Value Queue: 5 6 7 3 0
State value = 5:
    ctrl=1 ---> 7,
    ---> 8;
Value Queue: 6 7 3 0 8
State value = 6:
    ctrl=1 ---> 8,
    ---> 9;
Value Queue: 7 3 0 8 9
State value = 7:
    ---> 0;
Value Queue: 3 0 8 9
State value = 3:
    ---> 3;
Value Queue: 0 8 9
State value = 0:
    ---> 1;
Value Queue: 8 9
State value = 8
    ---> 0;
Value Queue: 9
State value = 9
    ---> 0;
Value Queue: empty
```

What is claimed is:

1. A method for fabricating an integrated circuit comprising the steps of:

describing a functionality of an integrated circuit in terms of a behavioral hardware description language, said hardware description language describing behavior which can be extracted as a state machine;

parsing and symbolically simulating said hardware description language to create an intermediate register level representation of said hardware description language;

extracting a register level state machine transition table from said intermediate register level representation;

generating a logic level state transition table representing said state machine from said register level state machine description;

creating a state machine structural netlist representing said state machine from said logic level state transition table; and combining said state machine structural netlist with an independently synthesized structural netlist to create an integrated circuit structural netlist including said state machine to provide a basis for chip compilation, mask layout and integrated circuit fabrication.

2. A method as recited in claim 1 wherein said hardware description language is selected from the group consisting of VHDL and Verilog.

3. A method as recited in claim 1 wherein said step of parsing and symbolically simulating comprises the steps of:

parsing to create a control flow graph including data elements of said integrated circuit;

symbolically simulating said control flow graph to create expressions represented by directed-acyclic graphs describing behavior of each data element in said control flow graph.

4. A method as recited in claim 3 wherein:

said step of extracting a register level state machine further includes recognizing a state register synthesis directive and a state encoding; and creating a state register in response to said state register synthesis directive.

5. A method as recited in claim 4 wherein said state register synthesis directive is provided within said hardware description language.

6. A method as recited in claim 4 wherein said state register synthesis directive is provided externally to said hardware description language via a user interface.

7. A method as recited in claim 4 wherein:

said register level state transition table is generated incrementally with values and conditions which are extracted from an directed-acyclic graph corresponding to said state register.

8. A method as recited in claim 7 wherein initial state values are extracted from said directed-acyclic graph corresponding to said state register by a generic state value extraction algorithm.

9. A method as recited in claim 8 further comprising the step of:

processing said directed-acyclic graph using register transfer level nodes to extract said values and conditions.

10. A method as recited in claim 9 wherein said register transfer level nodes include value nodes, net nodes, if-then-else nodes, and case nodes.

11. A method as recited in claim 1 further comprising the steps of:

partitioning intermediate register level representation into at least one control unit and at least one non-control unit;

extracting extraneous control logic from said non-control unit;

producing said register level state machine transition table using said control unit and said extraneous control logic.

12. A method as recited in claim 11 wherein said non-control unit comprises at least one of a memory, a data path, and random logic.

13. A method as recited in claim 1 further comprising the steps of:

creating a state register;

creating an directed-acyclic graph corresponding to said state register; and producing a plurality of state values and conditions from said directed-acyclic graph with a generic state value extraction algorithm.

14. A method as recited in claim 13 wherein extracting said register level state transition table includes using said generic state value extraction algorithm for explicit state value extraction from said directed-acyclic graph, and using said generic state value extraction algorithm for implicit state value extraction from said directed-acyclic graph evaluated when said state register is substituted by a state value.

15. A method of integrated circuit fabrication including register level state machine extraction from a behavioral hardware description language comprising the steps of:

inputting a hardware description language into a digital computer with a user input device, said hardware description language describing a state machine in terms of behavior;

parsing and symbolically simulating said hardware description language to create an intermediate register level representation of said hardware description language;

extracting a register level state machine transition table from said intermediate register level representation with a state machine extraction tool implemented on said computer;

generating a logic level state transition table with a logic level state transition table tool implemented on said computer;

synthesizing a state machine structural netlist from said logic level state transition table with a state machine compiler tool implemented on said computer; and combining on said computer said state machine structural netlist with an independently synthesized structural netlist to create an integrated circuit structural netlist.

16. A method as recited in claim 15 wherein said step of parsing and symbolically simulating comprises the steps of:

parsing to create a control flow graph including data elements of said integrated circuit;

symbolically simulating said control flow graph to create expressions represented by directed-acyclic graphs describing behavior of each data element in said control flow graph.

17. A method as recited in claim 16 further comprising the steps of:

partitioning intermediate register level representation into at least one control unit and at least one non-control unit;

extracting extraneous control logic from said non-control unit;

producing said register level state machine transition table using said control unit and said extraneous control logic.

18. A method as recited in claim 15 wherein said inputting step includes:

detecting a state machine synthesis directive;

creating a state register in response to said state machine synthesis directive; and creating an directed-acyclic graph corresponding to said state register.

19. A method as recited in claim 18 wherein said register level state transition table is generated incrementally with values and conditions which are extracted from said directed-acyclic graph.

20. A method as recited in claim 19 further comprising the step of:

processing said directed-acyclic graph using register transfer level nodes to extract said values and conditions.

21. A method as recited in claim 18 wherein initial state values are extracted from said directed-acyclic graph corresponding to said state register by a generic state value extraction algorithm.

22. A method as recited in claim 18 further comprising the step of:

producing a plurality of state values and conditions from said directed-acyclic graph with a generic state value extraction algorithm;

wherein extracting said register level state transition table includes using said generic state value extraction algorithm for explicit state value extraction from said directed-acyclic graph, and using said generic state value extraction algorithm for implicit state value extraction from said directed-acyclic graph evaluated when said state register is substituted by a state value.

23. A system for fabricating an integrated circuit comprising:

a digital computer system;

a hardware description language input into a digital computer with a user input device, said hardware description language describing a state machine in terms of behavior;

an extractor implemented on said computer to extract a register level state transition table from said hardware description language;

a transition table generator implemented on said computer to generate a logic level state transition table;

a synthesizer implemented on said computer to synthesize a state machine structural netlist from said logic level state transition table; and a combiner implemented on said computer system to combine on said computer said state machine structural netlist with an independently synthesized structural netlist to create an integrated circuit structural netlist.

24. A system as recited in claim 23 further comprising a chip compiler to convert said integrated circuit structural netlist into an IC layout including routing and placement.

25. A system as recited in claim 24 further comprising a mask layout generator to convert said IC layout into a multi-layer mask layout.

26. A system as recited in claim 25 further comprising a mask generator for making a plurality of masks from said multi-layer mask layout.

27. A system as recited in claim 26 further comprising semiconductor manufacturing equipment using said plurality of masks to produce an integrated circuit.

* * * * *